United States Patent [19]

Matsumoto

[11] 4,281,922
[45] Aug. 4, 1981

[54] PLATE FEEDING APPARATUS FOR PRINTING APPARATUS

[75] Inventor: Nobuo Matsumoto, Minami-ashigara, Japan

[73] Assignee: Fuji Photo Film Co., Ltd., Minami-ashigara, Japan

[21] Appl. No.: 91,926

[22] Filed: Nov. 7, 1979

[30] Foreign Application Priority Data

Nov. 14, 1978 [JP] Japan .......................... 53/156366[U]
Dec. 11, 1978 [JP] Japan .......................... 53/170659[U]
Jan. 5, 1979 [JP] Japan ................................ 54/753[U]

[51] Int. Cl.³ ............................................. G03B 27/04
[52] U.S. Cl. ....................................... 355/99; 355/100
[58] Field of Search ....................... 354/1; 355/99, 100, 355/50, 51, 3 SH, 14 SH

[56] References Cited

U.S. PATENT DOCUMENTS

| | | | |
|---|---|---|---|
| 3,116,675 | 1/1964 | Trimble | 355/100 |
| 3,751,164 | 8/1973 | Miller et al. | 355/100 |
| 4,149,798 | 4/1979 | McGowan et al. | 355/3 R X |

Primary Examiner—Richard A. Wintercorn
Attorney, Agent, or Firm—Sughrue, Mion, Zinn, Macpeak and Seas

[57] ABSTRACT

A printing in which printing plates are transferred from an endless belt to a printing station and automatically aligned on a printing base plate and a flexible transparency is aligned with the printing plate. A transfer mechanism is provided between the endless conveyor belt and the printing station including a frame member rotatable about a position adjacent to the endless belt. Transfer and control rollers are provided to direct and incoming printing plates through the transfer mechanism to the printing station while maintaining proper alignment thereof. During the printing operation, the transfer mechanism is rotatable to a position which blocks light from a new printing plate upon the endless conveyor belt. A torque amplifying mechanism is provided for detaching the flexible printing sheets from above the printing plates in the printing station.

18 Claims, 6 Drawing Figures

PLATE FEEDING APPARATUS FOR PRINTING APPARATUS

BACKGROUND OF THE INVENTION

The present invention relates to a printing plate apparatus particularly in one aspect, the invention relates to a presensitized plate (hereinafter referred to as a PS plate) feeding apparatus. Specifically, in this aspect, the invention relates to an apparatus for positioning a PS plate and feeding it to a succeeding process position such as printing process device.

Generally, a PS plate is a photosensitive material manufactured by coating an aluminum body with a photosensitive layer. The PS plate is considerably heavier than other photosensitive plates whose bodies are made of film or paper. For this reason, much manual effort is required to move PS plates rapidly and it is accordingly difficult to properly position such a plate. Therefore, it is desirable to be able to position a PS plate automatically. In addition, it is desired that a positioned PS plate be transferred to a succeeding process position or station without misalignment.

In view of the above-noted deficiencies, an object of the present invention is to provide a PS plate feeding apparatus having front-end positioning means provided in a delivery path of a PS plate which also are used as electrodes, transferring means for changeover from high speed delivery to low speed delivery when the PS plate reaches a predetermined position of the front end positioning means, and feed-out means for transferring the PS plate positioned by the front end positioning means to a succeeding process position, the feed-out means cooperating with the apparatus of the succeeding process position and being removable therefrom.

Another object of the present invention is to provide a plate feeding apparatus capable of feeding a printing material to a predetermined position, namely a printing position on the base plate without obstructing a mechanism for printing on the base plate and a mechanism for removing the printed material.

The present invention also relates to a device for close contact printing of a transparent picture plate such as may be used for printing a film onto a printing material such as a photosensitive film, a resin plate or a metallic plate.

There has been heretofore known a method in which a transparent picture plate is aligned on a printing material on a printing base plate, and a flexible transparent sheet is placed over the aligned picture plate and the printing material, and the inside of the sheet is exhausted by a vacuum pump or the like to thereby place it at a negative pressure and the flexible transparent sheet is squeezed by a squeeze roller to thereby closely contact the picture plate with the printing material. The sheet is then illuminated by light from above to thereby complete the printing process.

It was proposed in Japanese patent application No. 53-49460, which is of common inventionship, that the original picture be fixedly secured to the flexible transparent sheet for printing as described above for the purpose of maintaining contact between the original picture and the printing material and facilitating alignment of the original picture where the same original picture is repeatedly used for printing on the printing material plate to thereby enhance the efficiency of the operation. In this case, the printing material is automatically provided.

Further, the present applicant proposed a close contact printing device as described in Japanese Utility Model Application No. 53-95317. In this device, the original picture is positioned in place on the printing plate aligned on the printing base plate. After the picture is covered with a flexible transparent sheet, the inside of the transparent sheet is sealed using a vacuum method and further the upper surface thereof is squeezed by a squeeze roller to thereby contact the original image with the printing material. It is a feature of such a device, one end of the original picture retained in place on the printing material while the other end is held with an upward tension and that the squeeze roller is movable relatively to the base plate.

However, in a close contact printing device, since the other end of the transparent sheet is held under upward tension as mentioned above, when the squeeze roller is moved relatively in the opposite direction to the base plate in order to restore the flexible transparent sheet by removing the printed material after completion of printing, unless the other end of the flexible transparent sheet is moved at a speed higher than the relative movement speed therebetween, a crease or slack is produced in the flexible sheet and the original picture attached thereto is damaged. There are various techniques available for retaining the flexible sheet using a flexible spring, the gravity force of a movable weight, or a driving source. However, the technique using the movable weight is most desirable in view of cost and maintenance.

In the movable weight technique, if the speed that the squeeze roller is moved relative to the base plate is greater than the dropping speed of the weight, a crease or slack is produced in the flexible transparent sheet. The highest relative speed between the squeeze roller is thus naturally determined by the acceleration of the weight due to gravity.

The velocity of relative movement between the base plate and the squeeze roller for contacting the flexible transparent sheet with the original picture is defined in a range such that air between the printing material and the original picture is exhausted to thereby provide sufficient contact therebetween. Accordingly, it is difficult to attain a high velocity. However, the relative movement velocity for removal of the flexible transparent from the printing material can be enhanced within the range in which the other end of the flexible transparent sheet is maintained under tension.

In the case in which gravity is employed as described above, if the dropping velocity of the movable weight is increased, it is possible to sufficiently increase the relative velocity for removing the flexible transparent sheet from the printing material.

In view of the above noted deficiency, an object of the present invention is to provide a close contact printing device in which an original picture is placed in an overlapping arrangement on a printing plate which is aligned on a base plate, the original picture is covered with a flexible transparent sheet, the inside of the flexible transparent sheet is sealed, and the upper surface thereof is squeezed by a squeeze roller to bring the original picture into close contact with the printing plate. One end of the flexible transparent sheet aligning the original picture with the printing plate is fixed to the base plate while the other end is maintained under tension by a tensioning means. The squeeze roller is movable relative to the base plate. The tensioning means includes a weight movable by gravity. Transmitting means for amplifying the movement of the weight is provided whereby the other end of the flexible transparent sheet can be moved under tension at a higher speed than that at which the weight would fall due to its gravity force alone.

SUMMARY OF THE INVENTION

In accordance with these and other objects of the invention, there is provided according to the invention a plate feeding apparatus for feeding printing plates to a printing device or station including an endless conveyer belt for transporting printing plates, means for detecting printing plates passing a predetermined position on the endless conveyer belt, a first pair of rollers disposed to receive printing plates from the endless conveyer belt in a nip formed between the two rollers, a frame member rotatable between a horizontal position and a vertical position which is pivoted around a transfer roller disposed adjacent the pair of rollers, and a second pair of rollers disposed on the frame member parallel to the transfer roller and at an opposite end of the frame member. There may further be provided an opaque guide member having a central planar portion disposed between the transfer roller and the second pair of rollers. A printing plate base having vacuum grooves for holding a printing plate is stationed so as to receive printing plates from the upwardly disposed end of the frame member. A retractable stopper means may be provided on the base plate for stopping movement of an incoming printing plate by abutting a front edge thereof. And one embodiment, the endless conveyer belt is stopped in response to the detecting means while in an another embodiment, the speed of the endless conveyer belt is slowed but not stopped in response to the detecting means.

There may yet further be included means for moving printing plates conveyed by the endless conveyer belt in a direction normal to that in which the printing plates are conveyed by the endless conveyer belt, and electrode means forming an electrical circuit including a printing plate with the moving means being activated in response to electrical signal produced when the circuit through the printing plate and electrode means is completed. The moving means are positioned laterally of the endless belt.

In yet a further embodiment of the invention, one end of a flexible transparent sheet is attached to the base plate and a weight movable by a gravity is attached to a free end of the flexible sheet through a torque amplifying means. In this respect, the high-speed side of the torque amplifying means is coupled to the free end of the flexible sheet while the low-speed end of the torque amplifying means is coupled to the weight. The torque amplifying means preferably is constructed of a plurality of pulley means interconnected by a rope member. Rope member is here used as a generic term which includes flexible cables, chain members, and the like. Also, a squeeze roller may be positioned to press the sheet against the printing plate.

The invention may also be practiced by a close contact printing device including a basic plate for holding a printing plate aligned therewith, means for attaching one end of a flexible transparent sheet to the base plate, a squeeze roller positioned to press the upper surface of the sheet against the printing plate, torque amplifying means, and a weight movable by gravity, the weight being coupled to a free end of the flexible sheet through the torque amplifying means.

BRIEF DESCRIPTION OF THE DRAWINGS

Referring to the accompanying drawings, the present invention will now be described.

DESCRIPTION OF THE PREFERRED EMBODIMENTS

Figure 1:
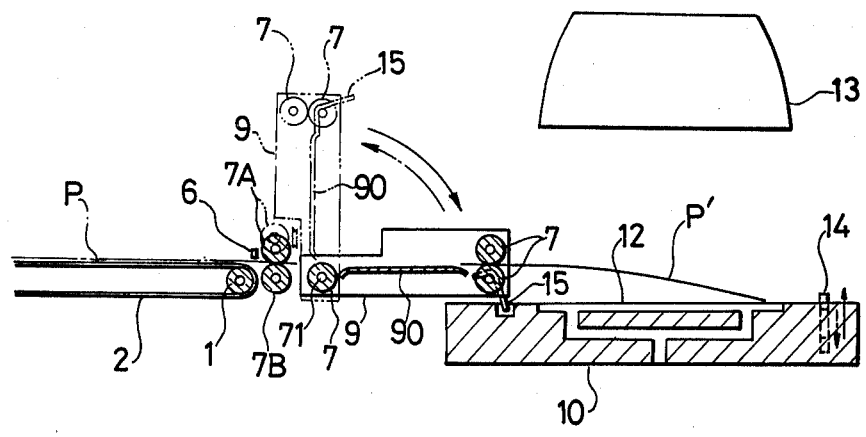
FIG. 1 is a lateral cross-sectional view showing a primary part of a plate feeding apparatus according to the present invention.

As shown in FIG. 1, the feeding apparatus of the invention includes an endless belt 2 supported by pulleys 1, a printing plate detecting device 6, control rollers 7A and 7B, transfer rollers 7, a guide 90 which also functions as a light blocking member, and a frame member or roller unit 9 rotatable reciprocatingly between vertical and horizontal positions. A printing device includes a base plate 10 provided with a vacuum groove 12 and a light source 13. A rear end guide member 151 is mounted on the upper end of the roller unit 9 and a front end positioning stopper 14 is provided at the front end of the printing position on the base plate 10.

In operation, a printing plate P is picked up by a plate lifting device (not shown) and placed on the endless belt 2 and is transferred by the endless belt 2 and is stopped a predetermined period of time after the front end of the printing plate is detected by the plate detecting means thereby halting the endless belt. At this time, the printing plate P is positioned at the position shown by a dotted line. An end portion of the printing plate P is retained between the control rollers 7A and 7B. Next, the printing plate P is delivered to a position designated by a solid line above the base plate 10 by the control rollers 7A and 7B. Next, the roller unit 9 is rotated to its upright position as shown by a dotted and dashed line so that the next-fed printing plate is hidden from the light emitted from the light source 13 by the guide 90. The front end stopper 14 is retracted into the base plate 10.

When the printing device is ready for feeding a new printing plate, that is, after printing of the previous printing plate has been completed and the plate is removed from the base plate 10, the roller unit 9 is rotated about a shaft 71 of one of the roller units to thereby engage with the base plate as shown in synchronization with the operation of the printing device. The end stopper 14 is projected from the base plate 10. The new printing plate is then fed by operation of the control rollers 7A and 7B and the feeding rollers 7 from the position indicated at P through the position indicated at P' onto the base plate 10. The vacuum groove 11 is constructed as a number of grooves in the delivery direction. The end of the printing plate is stopped in abutment against the stopper 14. Due to the forces exerted upon stopping, the printing plate P may have a tendency to return rearwardly slightly. However, the rear end of the printing plate is limited by the guide member 15. The printing plate slides along the guide member 15 to thereby feed the printing plate to a proper position for printing.

When the feeding of the printing plate P to the printing position has been finished, the roller unit 9 is disengaged from the base plate 10 and restored to the upright position. The upper control roller 7A is lifted upwardly and the stopper 14 is retracted into the base plate 10. Thereafter, the printing plate is precisely positioned by positioning means (not shown) and an original picture image is placed over the printing plate P by a suitable mechanism (nos shown) in order to expose and print the plate.

Figure 2:
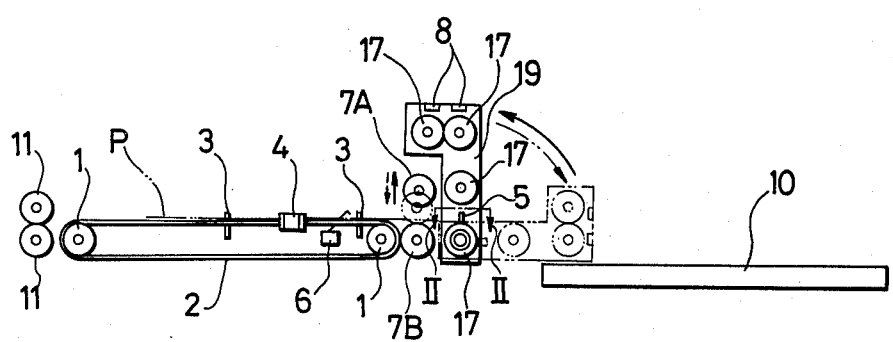
FIG. 2 shows a cross-sectional side view of a primary part of a printing apparatus embodying the invention.
Figure 3:
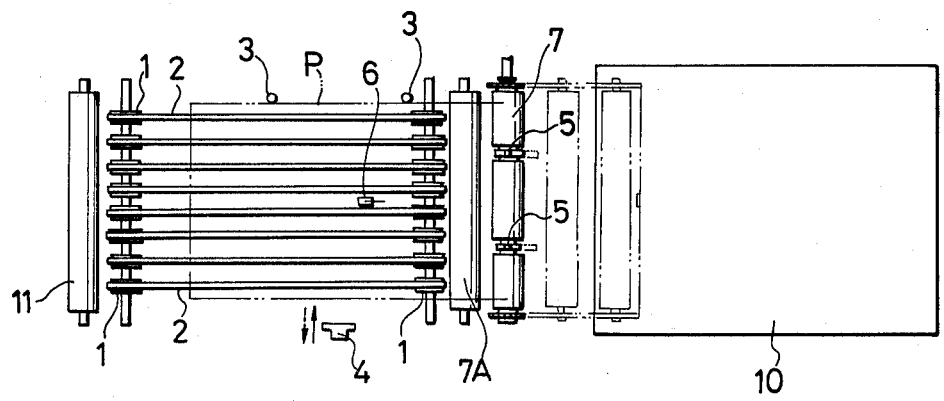
FIG. 3 shows a plan view of the apparatus of FIG. 2 in which a portion thereof is shown in a cross-sectional view taken along the line II—II of FIG. 2.

A printing and plate feeding apparatus of a second embodiment according to the present invention also includes a positioning mechanism and a feeding-out mechanism. In FIGS. 2 and 3, like reference numerals designate like components in common with the embodiment of FIG. 1. The positioning mechanism includes an endless belt 2 supported by pulleys 1, fixed side-end limiting members 3 which are also used as electrodes, a movable member 4 for pushing a side end of a PS plate P toward the side-end limiting member 3, front-end limiting members 5 which are positioned to abut against a front end of the PS plate. The front-end limiting members 5 are also used as electrodes. A microswitch 6 for detecting the front end of the PS plate reaching a predetermined position is provided in front of the front-end limiting members 5. A driving mechanism (not shown), and a control mechanism (not shown) are also provided. The front-end limiting members 5 are secured to the feeding-out mechanism. The feeding-out mechanism includes a pair of control rollers 7A and 7B with one roller 7A being movable up and down, plural transfer rollers 17, a roller unit 19 provided with photoelectric detecting devices 8 which function with infrared rays, a driving mechanism (not shown), and a control mechanism (not shown). The roller unit 19 is rotatable to cooperate with a next process position or station, namely a printing process station on a base plate 10. The front-end limiting member are rotated together with the roller unit 19.

In operation, when the PS plate P is fed from a previous process station through a pair of input rollers 11 to the thus constructed apparatus, the PS plate is transferred at a first speed which is the same as the rotational speed of the input rollers 11. When the front end of the PS plate reaches and is detected by the micro-switch 6, the PS plate is advanced by the control and driving mechanisms at a second speed which is slower than the first speed. When the front end of the PS plate is brought into smooth contact with the front-end limiting members 5 so that the aluminum body of the PS plate forms an electrically conductive path between the front-end limiting members 5, the PS plate is pushed in the direction normal to the delivery direction by operation of the side-end limiting movable member 4 in the direction as indicated by the solid arrow toward the side-end limiting fixed member 3. The side end of the PS plate P is in contact with the side-end limiting fixed members 3 and the aluminum body of the PS plate forms an electrically conductive path between the side-end limiting members thereby completing the positioning operation. At this time, the side-end limiting movable member 4 is returned to its original position by the driving and controlling means (not shown) as indicated by the dotted arrow and the feeding-out mechanism is then operated.

In the operation of the feeding-out mechanism, the roller unit 19 is rotated in the direction indicated by the dotted arrow to the position shown by the dotted lines and the roller unit 19 is engaged with the base plate 10. At the same time, the feeding-out roller 7A is lowered in a direction indicated by the dotted arrow pushing the roller 7B against the PS plate P. Together with the rotation of the roller unit 19 in the direction indicated by the dotted arrow, the front-end limiting members 5 are rotated away from the delivery path of the PS plate P. Thus, the aligned PS plate P is transferred to the base plate 10 at a high speed by the rollers 17, 7A and 7B.

Next, when the rear end of the PS plate is detected by the photoelectric detecting devices 8, the roller unit 9 is returned to its original position by rotating in the direction indicated by the solid line arrow and the roller 7A is lifted in the direction indicated by the solid line arrow to its original position. As the roller unit 9 is rotated in the direction of the solid arrow away from the base plate, the front-end limiting members 5 are returned so as to be disposed in the delivery path of the PS plate.

In the above-described embodiment, a belt conveyer or the like may be used instead of the roller unit as the feeding-out means. In the embodiment as described, a rotatable unit between the horizontal and vertical directions is used as the feeding-out mechanism which cooperates with the next process station. However, it is possible to use a unit which is slidable in the horizontal direction along a rail member or an equivalent mechanism.

As mentioned above, in the feeding apparatus of the invention, the PS plate is continuously transferred at a high speed except of course for the period when the PS plate is positioned on the base plate 10 for the exposure and printing operation. Further, since the feeding-out mechanism is designed to cooperate with the next process station and also to be removable therefrom, the PS plate is fed to a required position in the process station with a minimum of movement. As mentioned above, if the front-end limiting members are disposable into and removable from the delivery path of the PS plate synchronizing the engagement and disengagement operations of the feeding-out mechanism with the operation of the next process station, the number of potential difficulties with the mechanism is reduced. Moreover, as the front-end limiting members are rotated so as to be disposed and separated from the delivery path by rotation of the feeding-out mechanism, the construction thereof is considerably simplified enabling the front-end limiting members to be more positively operated.

Figure 4:
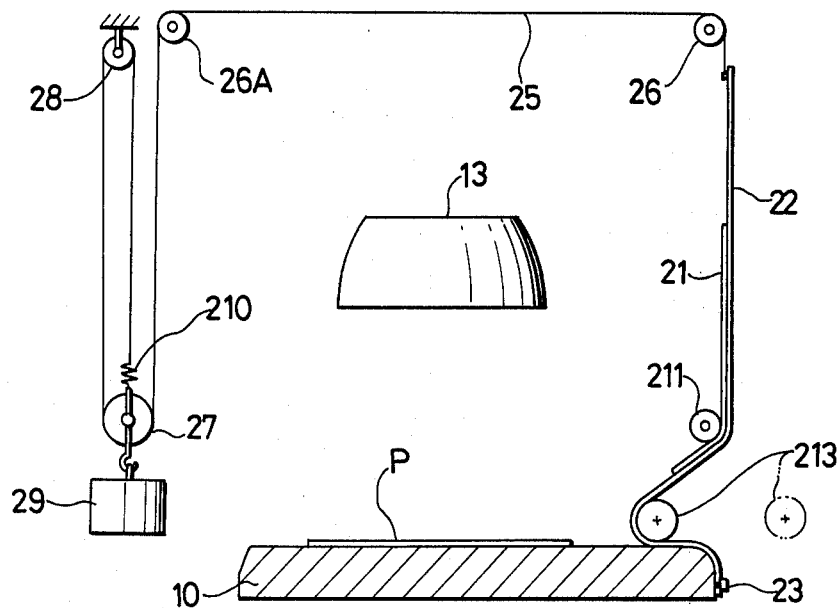
FIG. 4 shows a cross-sectional view of a primary portion of a cross contact printing device according to the present invention.

FIG. 4 shows a cross-sectional view of a primary portion of a close contact printing device according to the present invention. The close contact printing device includes a printing base plate 10 provided with a fastening member 23 for positioning and securing one edge of a flexible transparent sheet 22, a belt 25 connected to both sides of the other edge of the flexible transparent sheet 22 secured to the printing base plate 10, pulleys 26 and 26A for guiding the belt 25, a movable pulley 27 and a fixed pulley 28 forming a combined pulley, a weight 29 suspended from the movable pulley 27, a spring 210 for securing one end of the belt 25 with a damping effect, a guide roller 211 for guiding the flexible transparent sheet 22 and belt 25, a movable squeeze roller 213 for gradually overlapping the flexible transparent sheet 2 on the printing material P aligned on the printing base plate 10, a vacuum source (not shown) provided in the printing base plate 10, and a light source 13 for transparently printing the original picture 21 on the printing plate P.

In operation, the original picture 21 is secured to a predetermined position of the flexible sheet 22, that is, a position corresponding to the printing plate P, by a press-fit tape. While the squeeze roller 213 is retracted to a position indicated by a dotted line, one edge of the flexible transparent sheet 22 is secured to the fastening member 3 and both sides of the other edge of the flexible transparent sheet 22 are secured to one end of the belt 25 which is looped around the pulleys 26, 26A, 27 and 28 and is connected through the spring 210 to the movable pulley 7 so that the weight 29 suspended from the movable pulley 29 imparts a tension to the belt 25. Then, the squeeze roller 213 is moved through the position indicated by a solid line in FIG. 4 to the final position shown in FIG. 5. The flexible transparent sheet 22 is placed in an overlapping arrangement on the printing plate P. At this time, by operation of the vacuum source, the flexible transparent sheet 22 is brought into close contact with the printing base plate 10 under a vacuum. With the vacuum maintained, the exposure operation is carried out by illumination of the light source.

Figure 5:
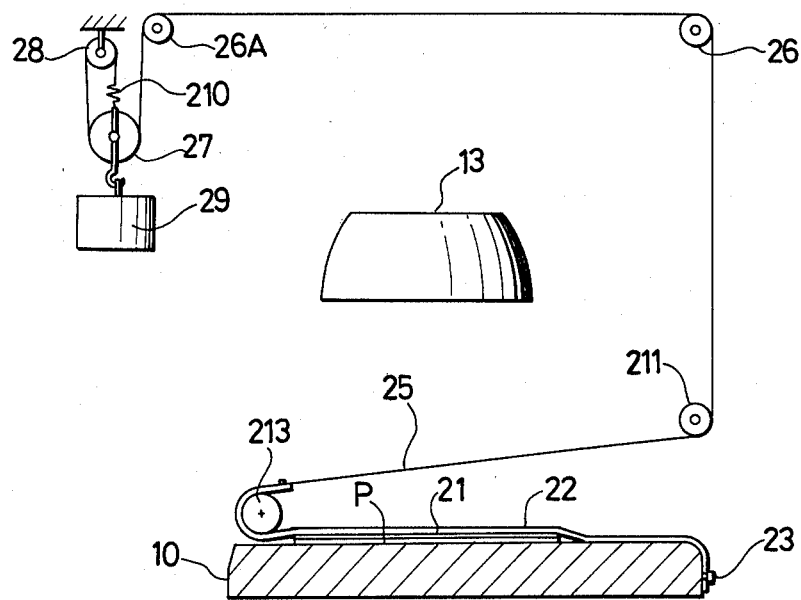
FIG. 5 shows the device of FIG. 4 with the device and a printing position.

After the exposure operation, the squeeze roller 213 is returned to the right in FIG. 5 to thereby restore the device to the state shown in FIG. 4. The exposure printing plate P is then replaced by a fresh printing plate. If the reciprocating movement of the squeeze roller 213 is synchronized with the replacement of the printing plates P, the exposures of plural printing plates using the single original plate can be automatically carried out.

The relationship of the movement between the squeeze roller 213 and the movable weight 29 will be hereinafter described in detail. The weight 29 is always moved at a speed which is one-third of the speed of the belt movement due to the pulley combination of the three pulleys 26A, 27 and 27, the pulley 27 being movable. On the other hand, since the squeeze roller 13 has the same function as a movable pulley with respect to the roller 211, the belt 25 is moved at twice the speed of the squeeze roller 213 movement speed. Accordingly, the weight 29 is moved up and down at a speed two-thirds that of the speed of the squeeze roller 213. For enhancement of the reciprocating speed of the squeeze roller in the embodiment described, the falling speed of the weight 29 is effectively tripled.

For multiplying the speed of the movable weight, a three unit pulley combination is used in the described embodiment. However, a compound pulley or other linkage wheel means may be used and, further, a lever arrangement, a differential pulley, a gear arrangement or other amplifying means may be used instead.

Figure 6:
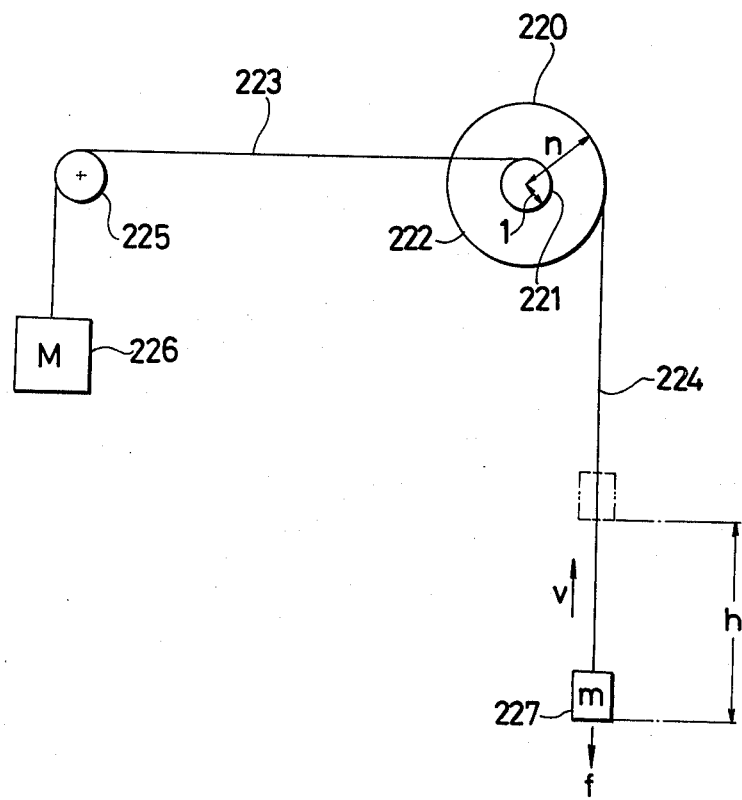
FIG. 6 is a mechanical schematic diagram utilized to illustrate the principle of operation of the apparatus shown in FIGS. 4 and 5.

FIG. 6 illustrates schematically an amplifying transmission arrangement in which movement of the movable weight and movement of the belt are related to the movement of the squeeze roller using a differential pulley. The differential pulley 220 is composed of a large diameter pulley 222 and a small diameter pulley 221 coaxially attached thereto. Ends of belts 223 and 224 are connected to the pulleys 221 and 222, respectively, in order to be wound or rewound thereon. The belt 223 is connected at the other end to a weight 226 through the pulley 225. The belt 224 is connected at the other end to an end of a flexible transparent sheet 227.

The following relationship may be derived. From the energy conservation law:

$$mgh - Mg(h/n) + fh + \tfrac{1}{2}mv^2 + \tfrac{1}{2}M(v/n)^2 = 0$$

Upon rearranging, $$\tfrac{1}{2}(m + M/n^2)v^2 = (M/ng - mg - f)h.$$

Solving for v, $$v = \sqrt{\frac{2\left(\frac{M}{n}g - mg - f\right)h}{m + \frac{M}{n^2}}},$$

Therefore, $$\text{at } n = 1, \quad V = \sqrt{\frac{2(Mg - mg - f)h}{m + M}} \quad \text{and}$$

$$\text{at } n = \infty, \quad v = \sqrt{\frac{2\left(\frac{M}{n}g - mg - f\right)h}{m}}$$

where:
M is the mass of the weight 226,
m is the mass of the vertical part of the flexible transparent sheet,
f is the frictional force,
n is the radius of the large diameter pulley when the radius of the small diameter pulley is normalized to 1,
v/2 is the velocity of the squeeze roller,
h/2 is the distance of movement of the squeeze roller, and
g is the acceleration of gravity.

As is apparent from the above relationship, the flexible transparent sheet can be always drawn under tension by selecting the values of n and M so that the returning velocity of the squeeze roller is always less than v/2.

As mentioned above, the base plate and the squeeze rollers are moved relatively in order to remove the flexible transparent sheet from the printed plate P and to restore the original position. In this case, the present invention provides a technique for maintaining tension in the sheet. Implementation of this technique are low in cost and maintenance with no damage to the attached original picture while operating at high speed.

What is claimed is:

1. A plate feeding apparatus for feeding printing plates to a printing apparatus one after another in synchronization with the operation of the printing apparatus comprising feeding-out means engageable with the printing apparatus while a printing plate is being transferred from the feeding-out means to the printing apparatus and disengageable therefrom during printing of said printing plate, a front-end stopper means projectable from a base plate during feeding of said printing plate and retractable into said base plate during printing of said printing plate, and rear-end guide means provided at an end of the feeding-out means adapted to be received in an aperture in said base plate.

2. The plate feeding apparatus of claim 1 wherein said feeding-out means is rotatable from a horizontal position for plate feeding to a vertical position for printing and the feeding-out means further comprises means for shutting off light in the vertical position.

3. A plate feeding apparatus for feeding printing plate to a printing apparatus comprising:
an endless conveyor belt for transporting printing plates;
means for detecting printing plates passing a predetermined position on said endless conveyor belt;
a first pair of rollers disposed to receive printing plates from said endless conveyor belt in a nip formed between said two rollers;
a frame member rotatable between a horizontal position and a vertical position, and frame member being pivoted around a transfer rollers disposed adjacent said pair of rollers; and
a second pair of rollers disposed on said frame member parallel to said transfer roller and at an opposite end of said frame member.

4. The plate feeding apparatus of claim 3 further comprising an opaque guide member having a central planar portion and disposed between said transfer roller and said second pair of rollers.

5. The plate feeding apparatus of claim 3 further comprising a printing plate base plate, said base plate having vacuum grooves for holding a printing plate to said lose plate.

6. The plate feeding apparatus of claim 5 further comprising retractable stopper means provided on said base plate for stopping movement of an incoming printing plate by abutting a front edge thereof.

7. The plate feeding apparatus of claim 3 wherein said endless conveyer belt is stopped in response to said detecting means.

8. The plate feeding apparatus of claim 3 wherein the speed of said endless conveyor belt is slowed in response to said detecting means.

9. The plate feeding apparatus of claim 3 further comprising:
means for moving printing plates conveyed by said endless conveyor belt in a direction normal to that in which said printing plates are conveyed by said endless conveyor belt; and
means for forming an electrical circuit including a printing plate, said moving means being activated in response to said electrical circuit forming means.

10. The plate feeding apparatus of claim 9 wherein said moving means are positioned laterally of said endless belt.

11. The plate feeding apparatus of claim 3 further comprising:
one end of a flexible transparent sheet to said base plate;
torque amplifying means; and
a weight movable by gravity, said weight being coupled to a free end of said flexible sheet through said torque emplifying means.

12. The plate feeding apparatus of claim 11 wherein said torque amplifying means comprises a plurality of pulley means interconnected by a rope member.

13. The plate feeding apparatus of claim 11 further comprising a squeeze roller positioned to press said sheet against said printing plate.

14. A PS plate feeding apparatus comprising front-end positioning means provided in a delivery path of a PS plate comprising electrode means, transferring means for changing from a high delivery speed to a low delivery speed when the PS plate reaches a predetermined position with respect to the front-end positioning means, and feeding-out means for transferring the PS plate positioned by the front-end positioning means to succeeding process station, said feeding-out means being selectively coupled to and separated from the succeeding process station.

15. The PS plate feeding apparatus of claim 14 wherein the front-end positioning means is disposable in the delivery path and removable therefrom, and said front-end positioning means is synchronized with operations of the succeeding process station.

16. A close contact printing device comprising:
a base plate for holding a printing plate aligned therewith;
means for attaching one end of a flexible transparent sheet to said base plate;
a squeeze roller positioned to press the upper surface of said sheet against said printing plate;
torque amplifying means; and
a weight movable by gravity, said weight being coupled to a free end of said flexible sheet through said torque amplifying means.

17. The printing device of claim 16 wherein said torque amplifying means comprises a plurality of pulley means interconnected by rope means.

18. The printing device of claim 17 wherein a high speed end of said rope means is coupled to said flexible sheet.

* * * * *